(12) United States Patent
Raj

(10) Patent No.: US 12,451,901 B2
(45) Date of Patent: Oct. 21, 2025

(54) CIRCUITRY FOR CONVERTING A DIGITAL SIGNAL TO AN ANALOG SIGNAL

(71) Applicant: Microchip Technology Incorporated, Chandler, AZ (US)

(72) Inventor: Naveen Raj, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 209 days.

(21) Appl. No.: 18/231,371

(22) Filed: Aug. 8, 2023

(65) Prior Publication Data
US 2024/0283461 A1 Aug. 22, 2024

Related U.S. Application Data

(60) Provisional application No. 63/447,125, filed on Feb. 21, 2023.

(51) Int. Cl.
*H03M 1/74* (2006.01)
(52) U.S. Cl.
CPC ..................... *H03M 1/74* (2013.01)
(58) Field of Classification Search
CPC ........... H03M 1/68; H03M 1/74; H03M 1/662
See application file for complete search history.

(56) References Cited

U.S. PATENT DOCUMENTS

| | | | | |
|---|---|---|---|---|
| 5,960,092 A | * | 9/1999 | Lai | H03G 3/002 381/104 |
| 6,473,011 B1 | * | 10/2002 | Steensgaard-Madsen | H03M 1/0673 341/150 |
| 6,486,818 B1 | | 11/2002 | Nicholson et al. | 341/154 |
| 8,922,412 B1 | * | 12/2014 | Gorman | H03M 1/0604 341/144 |
| 8,947,281 B1 | * | 2/2015 | Azarmnia | H03M 1/0609 341/118 |
| 2003/0141998 A1 | * | 7/2003 | Matsui | H03M 1/687 341/145 |
| 2003/0210165 A1 | * | 11/2003 | Carreau | H03M 1/1004 341/172 |

(Continued)

OTHER PUBLICATIONS

Wang Peng et al 2nd Order shaping technique of the DAC mismatch error in noise vol. 102, No. 1, Dec. 16, 2019, pp. 265-271.*

(Continued)

*Primary Examiner* — Lam T Mai
(74) *Attorney, Agent, or Firm* — SLAYDEN GRUBERT BEARD PLLC

(57) ABSTRACT

The disclosure relates to circuitry, systems, and methods for digital-to-analog conversion. In various examples, a corresponding circuitry may comprise a first digital-to-analog conversion circuit to provide a first analog output signal and a second digital-to-analog conversion circuit to provide a second analog output signal. The circuitry may comprise addition circuitry to provide a combined analog output signal from the first analog output signal and the second analog output signal. A first voltage reference circuit, connected with the first digital-to-analog conversion circuit to provide a first reference voltage and a second voltage reference circuit, connected with the second digital-to-analog conversion circuit to provide a second reference voltage may be provided. The first reference voltage and the second reference voltage may differ from each other.

18 Claims, 11 Drawing Sheets

(56) References Cited

U.S. PATENT DOCUMENTS

| | | | | | |
|---|---|---|---|---|---|
| 2006/0103743 | A1* | 5/2006 | Ono | ......................... | H04N 5/16 |
| | | | | | 348/257 |
| 2007/0096965 | A1* | 5/2007 | Gillespie | ............. | H03M 1/0607 |
| | | | | | 341/144 |
| 2008/0018517 | A1* | 1/2008 | Yamada | ................... | H03M 1/58 |
| | | | | | 341/165 |
| 2010/0079317 | A1* | 4/2010 | Feddeler | ............. | H03M 1/1071 |
| | | | | | 341/120 |
| 2012/0274489 | A1* | 11/2012 | Chang | ................... | H03M 1/462 |
| | | | | | 341/110 |
| 2013/0093609 | A1* | 4/2013 | Chang | ................... | H03M 1/462 |
| | | | | | 341/110 |
| 2014/0191889 | A1* | 7/2014 | Haneda | ................. | H03M 1/069 |
| | | | | | 341/118 |
| 2015/0180496 | A1* | 6/2015 | Drago | ..................... | H03M 1/46 |
| | | | | | 341/122 |
| 2016/0099722 | A1* | 4/2016 | Lin | ....................... | H03M 1/466 |
| | | | | | 341/118 |
| 2016/0233878 | A1* | 8/2016 | Fuwa | ...................... | G06F 3/045 |
| 2021/0351781 | A1 | 11/2021 | Daly et al. | | |
| 2023/0163777 | A1* | 5/2023 | Yagishita | ............ | H03M 1/1245 |
| | | | | | 341/126 |
| 2024/0196493 | A1* | 6/2024 | Hwang | ................. | H05B 45/325 |
| 2025/0088199 | A1* | 3/2025 | Raj | ....................... | H03M 1/662 |

OTHER PUBLICATIONS

Kwon et al. An Area Effective Source Driver with 12 bit Linear DAC, vol. XXX, May 31, 2009, pp. 367-370.*

Yang, Ik-Seok et al., "27.1: An Area-Effective Source Driver with 12-Bit Linear DAC for Large-Size TFT-LCDs," 2009 SID International Symposium, Society for Information Display, vol. XXXX, pp. 367-370, May 31, 2009.

Wang, Peng et al., "$2^{nd}$-Order Shaping Technique of the DAC Mismatch Error in Noise Shaping SAR ADCs," Analog Integrated Circuits and Signal Processing, vol. 102, No. 1, pp. 265-271, Dec. 16, 2019.

International Search Report and Written Opinion, Application No. PCT/US2023/030665, 20 pages, Dec. 19, 2023.

* cited by examiner

FIG. 3

| INITIAL CODES | | | | | |
|---|---|---|---|---|---|
| CODE | DAC1 CODE | DAC2 CODE | DAC1 OUTPUT [V] | DAC2 OUTPUT [V] | DAC1+DAC2 [V] |
| 0 | 0 | 0 | 0 | 0 | 0 |
| 1 | 0 | 1 | 0 | 0.00031 | 0.00031 |
| 2 | 0 | 2 | 0 | 0.00061 | 0.00061 |
| 3 | 0 | 3 | 0 | 0.00092 | 0.00092 |
| 4 | 1 | 0 | 0.00122 | 0 | 0.00122 |
| 5 | 1 | 1 | 0.00122 | 0.00031 | 0.00153 |
| 6 | 1 | 2 | 0.00122 | 0.00061 | 0.00183 |
| 7 | 1 | 3 | 0.00122 | 0.00092 | 0.00214 |
| 8 | 2 | 0 | 0.00244 | 0 | 0.00244 |
| 9 | 2 | 1 | 0.00244 | 0.00031 | 0.00275 |
| 10 | 2 | 2 | 0.00244 | 0.00061 | 0.00305 |
| 11 | 2 | 3 | 0.00244 | 0.00092 | 0.00336 |
| 12 | 3 | 0 | 0.00366 | 0 | 0.00366 |
| 13 | 3 | 1 | 0.00366 | 0.00031 | 0.00397 |
| 14 | 3 | 2 | 0.00366 | 0.00061 | 0.00427 |
| 15 | 3 | 3 | 0.00366 | 0.00092 | 0.00458 |
| 16 | 4 | 0 | 0.00488 | 0 | 0.00488 |
| 17 | 4 | 1 | 0.00488 | 0.00031 | 0.00519 |
| THE LAST FEW CODES | | | | | |
| 16363 | 4090 | 3 | 4.99389 | 0.00092 | 4.99481 |
| 16364 | 4091 | 0 | 4.99512 | 0 | 4.99512 |
| 16365 | 4091 | 1 | 4.99512 | 0.00031 | 4.99543 |
| 16366 | 4091 | 2 | 4.99512 | 0.00061 | 4.99573 |
| 16367 | 4091 | 3 | 4.99512 | 0.00092 | 4.99604 |
| 16368 | 4092 | 0 | 4.99634 | 0 | 4.99634 |
| 16369 | 4092 | 1 | 4.99634 | 0.00031 | 4.99665 |
| 16370 | 4092 | 2 | 4.99634 | 0.00061 | 4.99695 |
| 16371 | 4092 | 3 | 4.99634 | 0.00092 | 4.99726 |
| 16372 | 4093 | 0 | 4.99756 | 0 | 4.99756 |
| 16373 | 4093 | 1 | 4.99756 | 0.00031 | 4.99787 |
| 16374 | 4093 | 2 | 4.99756 | 0.00061 | 4.99817 |
| 16375 | 4093 | 3 | 4.99756 | 0.00092 | 4.99848 |
| 16376 | 4094 | 0 | 4.99878 | 0 | 4.99878 |
| 16377 | 4094 | 1 | 4.99878 | 0.00031 | 4.99909 |
| 16378 | 4094 | 2 | 4.99878 | 0.00061 | 4.99939 |
| 16379 | 4094 | 3 | 4.99878 | 0.00092 | 4.9997 |
| 16380 | 4095 | 0 | 5 | 0 | 5 |
| 16381 | 4095 | 1 | 5 | 0.00031 | 5.00031 |
| 16382 | 4095 | 2 | 5 | 0.00061 | 5.00061 |
| 16383 | 4095 | 3 | 5 | 0.00092 | 5.00092 |

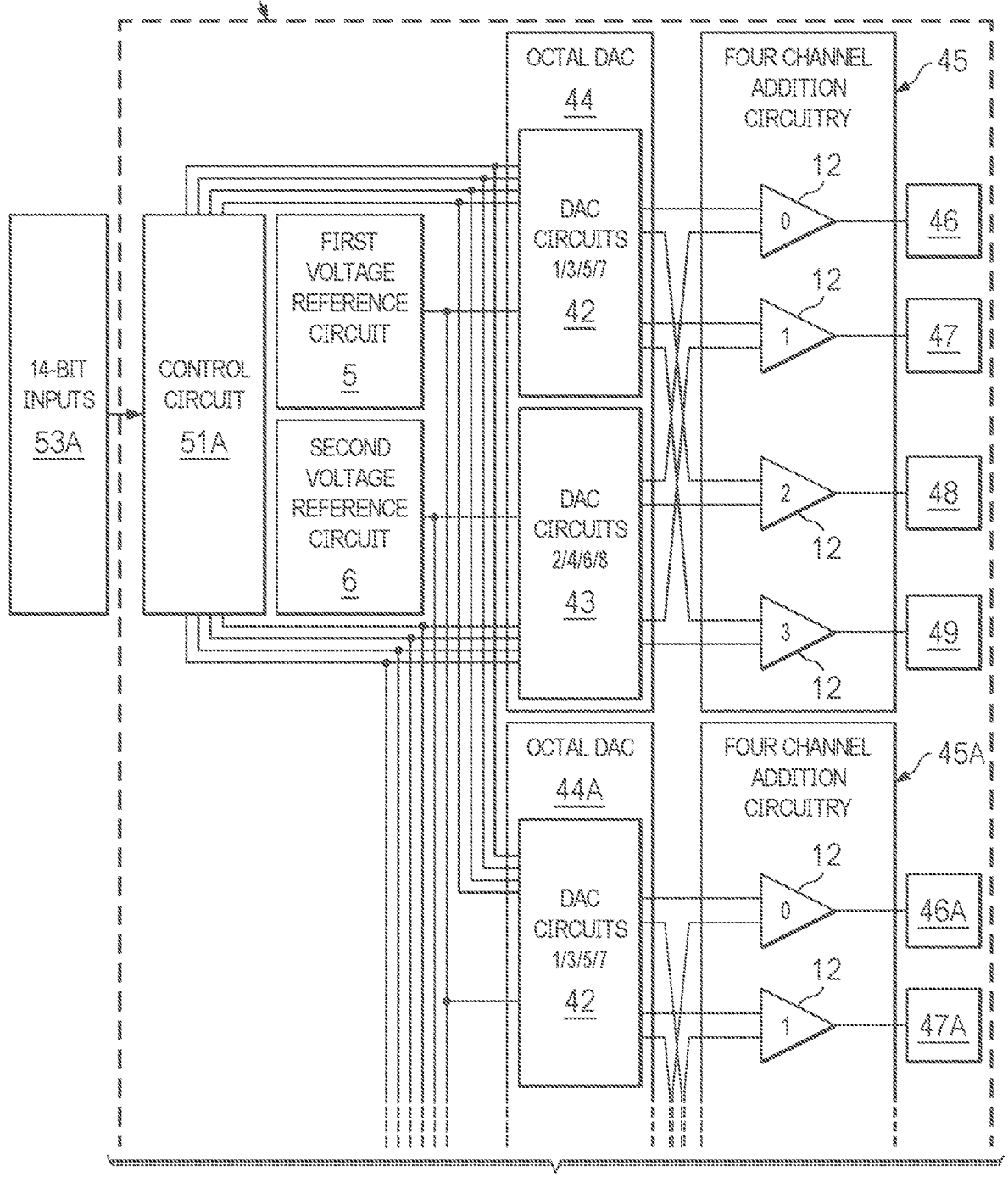

CIRCUITRY FOR CONVERTING A DIGITAL SIGNAL TO AN ANALOG SIGNAL

CROSS-REFERENCE TO RELATED APPLICATIONS

This application claims priority to U.S. Provisional Patent Application No. 63/447,125, filed Feb. 21, 2023, with the United States Patent and Trademark Office. The contents of the aforesaid Patent Application are incorporated herein for all purposes.

TECHNICAL FIELD

The present disclosure relates to digital to analog signal conversion.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

When converting a digital signal to an analog signal, a digital-to-analog converter is typically used. Digital-to-analog converters are designed with a resolution in bits that indicates the number of discrete steps (e.g., voltage steps) that the respective digital-to-analog converter can provide. A digital input signal that is provided to the digital-to-analog converter usually has a bit depth, i.e., the number of bits of each sample, which bit depth usually corresponds to the resolution of the digital-to-analog converter.

In the field of signal processing, for example for sensor applications, a typically used resolution is 12 bits. Higher resolution digital-to-analog converters are not commonly used in the field of signal processing.

The present inventor has realized that a higher resolution digital-to-analog signal conversion may be desirable for certain applications. However, providing a higher resolution digital-to-analog signal conversion while providing a high conversion quality typically adds significant complexity and cost to corresponding circuitry.

SUMMARY

A need exists to provide efficient circuitry, systems, and methods for converting a digital signal to an analog signal with a high conversion quality. The need is addressed by the subject matter of the independent claims. Various embodiments are described in the dependent claims, the following description, and the drawings.

BRIEF DESCRIPTION OF THE DRAWINGS

FIG. 3 shows example input codes and the resulting output voltages for the examples shown in FIGS. 1A and 1B;

FIGS. 6A and 6B shows another example of a 14-bit D/A conversion using 12-bit bit digital-to-analog circuits.

DESCRIPTION

Figure 1A:
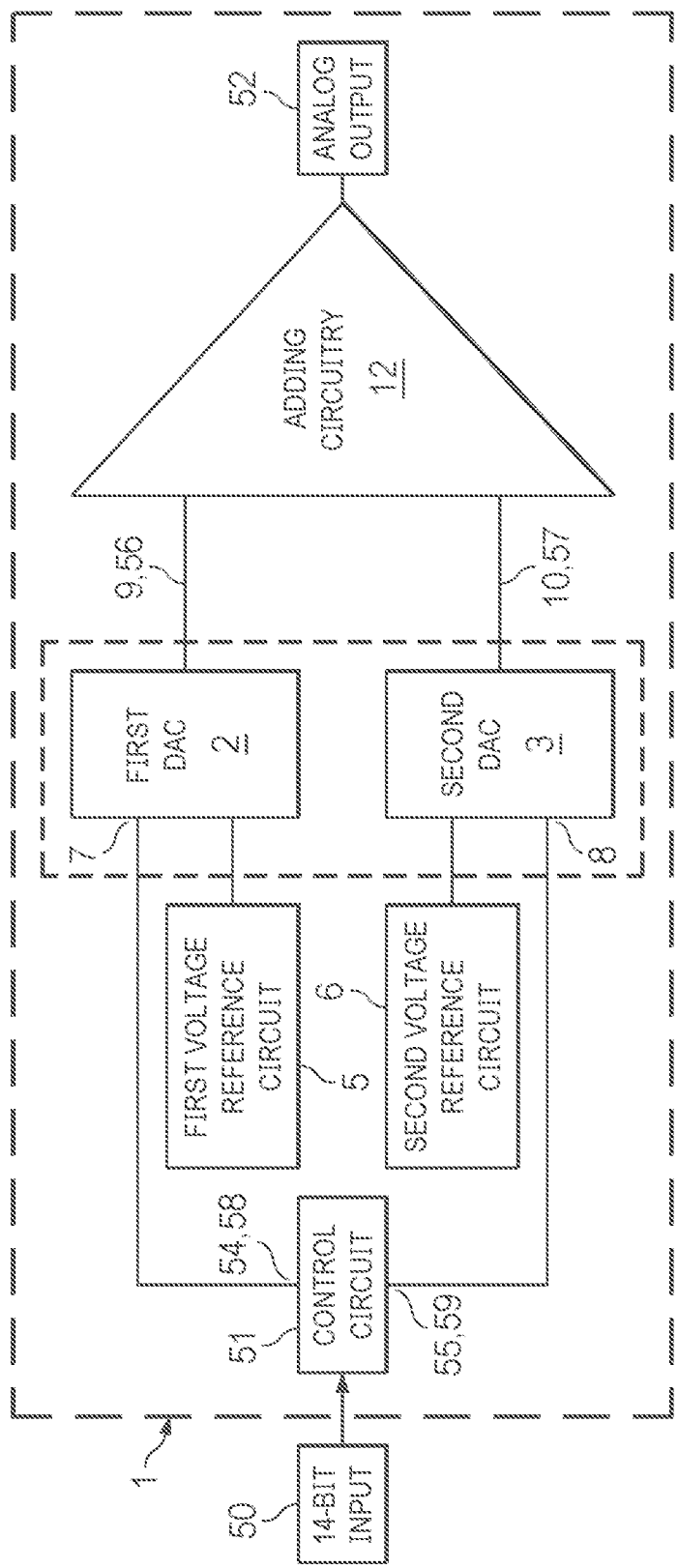
FIG. 1A shows a schematic block diagram of an example of circuitry implementing a 14-bit D/A conversion with two 12-bit digital-to-analog circuits.

The details of various examples are set forth in the accompanying drawings and the description below. Other features will be apparent from the description, drawings, and from the claims.

In the following description of various examples, specific details are described in order to provide a thorough understanding of the technical teaching(s) presented herein. However, it will be apparent to one of ordinary skill in the art that the teaching(s) may be practiced without these specific details. In other instances, well-known features have not been described in detail to avoid unnecessarily complicating the instant description.

In the following explanation of the present invention according to various examples described the terms "connected to" or "connected with" are used to indicate a connection between at least two elements, such as components, devices, units, processors, circuits, and/or modules. Such a connection may be direct between the respective elements or indirect, i.e., over intermediate elements. The connection may be permanent or temporary; wireless or conductor based; digital or analog. The connection may be used for a signal or be used to provide power, e.g., an operating current and/or voltage.

In the following description, ordinal numbers (e.g., first, second, third, without limitation) may be used as an adjective for an element (i.e., any noun in the application). The use of ordinal numbers is not to imply or create any particular ordering of the elements nor to limit any element to being only a single element unless expressly disclosed, such as by the use of the terms "before", "after", and other such terminology. Rather, the use of ordinal numbers is to distinguish between like-named elements. For example, a first element is distinct from a second element, and the first element may encompass more than one element and succeed (or precede) the second element in an ordering of elements.

In the context of this discussion, the terms 'circuitry' and 'circuit' are understood broadly to comprise hardware and hardware/software combinations to provide the respectively discussed functionality. The respective 'circuitry' or 'circuit' may be formed integrally, such as for example as a semiconductor component. In various examples, the respective 'circuitry' or 'circuit' may be formed integrally with further components. For example, the functionality of the respective 'circuitry' or 'circuit' may be provided by a microprocessor, microcontroller, FPGA, or the like, with corresponding programming. The programming may be provided as software or firmware, for example stored in a memory, or may be provided by dedicated ('hard-wired') circuitry.

A need exists to provide improved methods and systems for converting a digital signal to an analog signal.

In various examples, a circuitry for converting a digital signal to an analog signal comprises at least a first digital-to-analog conversion circuit, comprising a first digital input and a first analog output, the first analog output to provide a first analog output signal. In various examples, the circuitry may comprise a second digital-to-analog conversion circuit, comprising a second digital input and a second analog output, the second analog output to provide a second analog output signal. In various examples, the circuitry for converting a digital signal to an analog signal comprises addition circuitry, connected with the first analog output and the second analog output, capable to provide a combined analog output signal from the first analog output and the second analog output. In various examples, the circuitry for converting a digital signal to an analog signal comprises a first voltage reference circuit, connected with the first digital-to-analog conversion circuit to provide a first reference voltage ($V_{REF1}$) to the first digital-to-analog conversion circuit. In various examples, the circuitry for converting a digital signal to an analog signal comprises a second voltage reference circuit, connected with the second digital-to-analog conversion circuit to provide a second reference voltage ($V_{REF2}$) to the second digital-to-analog conversion circuit. In various examples, the first reference voltage and the second reference voltage differ from each other. In various examples, the first voltage reference circuit and the second reference voltage circuit are capable to set the first reference voltage and the second reference voltage accordingly. In various examples, the two or more external voltage references each provide a respective reference voltage denoted $V_{REF,x}$.

The first digital-to-analog conversion circuit and the second digital-to-analog conversion circuit may be of any suitable type to each provide an analog output signal from a respectively applied digital input signal.

The addition circuitry may be of any suitable type to provide the combined analog output signal from the first analog output signal and the second analog output signal. In various examples, the addition circuitry is capable to add the first analog output signal and the second analog output signal, e.g., to add the respective voltages. In various examples, the addition circuitry comprises a summing circuit. In various examples, the addition circuitry comprises one or more operational amplifiers (Op-Amps). In various examples, the addition circuitry comprises one or more Schottky diodes.

The first voltage reference circuit and the second voltage reference circuit may be of any suitable type to provide the first reference voltage and the second reference voltage, respectively.

In various examples, the voltage references are external voltage references, i.e., external to the digital-to-analog conversion circuits. In various examples, the voltage references may be off-the-shelf devices. Such devices are typically pre-tested, which may reduce the cost of the setup. In various examples, the voltage references may be calibrated voltage references. In various examples, the second reference voltage is less than the first reference voltage.

In various examples, one or more of the voltage references comprise at least one high precision buffered voltage reference, such as for example MCP1501 or MCP1502 voltage references, available from Microchip Technology, Inc, of Chandler, Arizona. The MCP1502 is a low-drift (7 ppm max.) bandgap-based reference and uses chopper-based amplifiers which significantly reduces drift and provides high current output. A high precision buffered voltage reference is understood herein as having an initial accuracy of less than 0.25%, for example less than or equal to 0.10%, wherein the initial accuracy is understood as the variance of output voltage as measured at a given temperature, usually room temperature (25 C).

In various examples, the first digital-to-analog conversion circuit and/or the second digital-to-analog conversion circuit are formed integrated, e.g., as semiconductor components. In various examples, the first digital-to-analog conversion circuit and the second digital-to-analog conversion circuit are formed integrally with at least each other, for example in a single semiconductor component. In various examples, the first digital-to-analog conversion circuit and/or the second digital-to-analog conversion circuit comprises a 1 least significant bit (LSB) INL (Integral Nonlinearity) digital-to-analog converter (DAC).

In various examples, the first digital-to-analog conversion circuit and the second digital-to-analog conversion circuit are formed by one or more multi-channel DACs. In various examples, the first digital-to-analog conversion circuit and the second digital-to-analog conversion circuit are formed by a MCP48CMB28 DAC, available from Microchip Technology. MCP48CMB28 is an octal channel, 12-bit, buffered voltage output DAC with a multi-time programming (MTP) memory and a serial peripheral interface (SPI) compatible serial interface.

In various examples, the first digital-to-analog conversion circuit and/or the second digital-to-analog conversion circuit have the same resolution. In the present context, the term 'resolution' is used corresponding to the typical use in the art, namely a resolution of n bits that indicates the number ($2^n$) of discrete steps (e.g., voltage steps) that the respective digital-to-analog conversion circuit can convert to respective different analog voltages. In various examples, the first digital-to-analog conversion circuit and/or the second digital-to-analog conversion circuit, respectively, have a resolution of 12 bits.

In various examples, the circuitry for converting a digital signal to an analog signal comprises at least one control circuit.

In the context of this discussion, the term 'control circuit' is understood broadly to comprise hardware and hardware/software combinations to provide the respectively discussed functionality. The respective 'control circuit' may be formed integrally, such as for example as a semiconductor component. In various examples, the respective 'control circuit' may be formed integrally with further components. For example, the functionality of the respective 'control circuit' may be provided by one or more of a microprocessor, microcontroller, FPGA, shift register, tapped register, counter, timing circuit, and the like, for example with corresponding programming. The programming may be provided as software or firmware, for example stored in a memory, or may be provided by dedicated ('hard-wired') circuitry.

In various examples, the at least one control circuit comprises at least a digital input, a first digital output, and a second digital output. The first digital output may be connected with the first digital input of the first digital-to-analog conversion circuit. The second digital output may be connected with the second digital input of the second digital-to-analog conversion circuit. In various examples, the control circuit provides or generates at least a first digital output signal, provided at the first digital output, and a second digital output signal, provided at the second digital output, from a digital input signal, received at the digital input. In various examples, the control circuit may copy at least a portion of the data of the digital input signal to the first and/or second digital output signal. In various examples, the control circuit may split (divide) the digital input signal according to a predefined method, e.g., bitwise, into the first digital output signal and the second digital output signal. The term 'to split' is to be interpreted broadly in the present context and includes setups, in which bits are dropped, i.e., not copied to the first digital output signal, nor copied to the second digital output signal. In various examples, the digital input signal represents one or more samples of a continuous signal with a (predefined) total number of bits, i.e., a predefined bit depth (sometimes also referred to as a 'resolution' of the digital input signal). In various examples, such a continuous signal may be an output of an analog sensor that has been converted into a digital signal. However, it is noted that the teachings herein are not limited to sensor applications. In various examples, the digital input signal has a bit depth that is greater than a resolution of one or more of the first digital-to-analog conversion circuit and the second digital-to-analog conversion circuit. In various examples, the connection between the at least one control circuit and the first and second digital-to-analog conversion circuits, respectively, may be provided using SPI compatible serial interfaces.

In various examples, the at least one control circuit to provide the first digital output signal with one or more samples having a predefined number of most significant bits of the respective samples of the digital input signal. In various examples, the control circuit to provide the second digital output signal with a predefined number of least significant bits of the respective samples of the digital input signal.

In other words, the control circuit may copy portions of the data of each sample of the digital input signal over to the first digital output signal and/or the second digital output signal. The control circuit thus may copy, forward, or reproduce the data of the digital input signal.

The bit depth of the first digital output signal may correspond to the number of most significant bits copied and the bit depth of the second digital output signal may correspond to the number of least significant bits copied.

In various examples, the control circuit may provide the number of most significant bits and the number of least significant bits so as to add up to the total number of bits per sample of the digital input signal. In other words, respective bits of the one or more samples of the digital input signal are either copied to the first digital output signal or the second digital output signal.

In various examples, the sampling rate (samples per second) of the first digital output signal corresponds to the sampling rate of the second digital output signal. In various examples, this sampling rate corresponds to the sampling rate of the digital input signal.

In various examples, the predefined number of most significant bits corresponds to a resolution of the first digital-to-analog conversion circuit. Accordingly, the resolution of the first digital output signal may correspond to the resolution of the first digital-to-analog conversion circuit.

As discussed in the preceding, the first reference voltage and the second reference voltage may differ from each other. In various examples, the second reference voltage ($V_{REF2}$) is:

$$V_{REF2} = \frac{V_{REF1}}{2^{n_2}} \tag{1}$$

namely the first reference voltage ($V_{REF1}$) divided by two to the power of the number of bits $n_2$ applied to the second digital-to-analog conversion circuit, i.e., the resolution of the second digital output signal. $n_2$ may be equal to or greater than 1 and is a full integer value. For each increment for the value of $n_2$, the resolution increases by one bit, and the ratio between $V_{REF1}$ to $V_{REF2}$ increases by a multiple of 2.

In various examples, a system for converting a digital signal to an analog signal is provided. In various examples, the system comprises a first voltage reference circuit to provide a first reference voltage and a second voltage reference circuit to provide a second reference voltage, wherein the first reference voltage and the second reference voltage differ from each other.

In various examples, the system comprises first circuitry and second circuitry.

In various examples, the first circuitry comprises a first digital-to-analog conversion circuit, comprising a first digital input and a first analog output, the first digital-to-analog conversion circuit being connected to the first voltage reference circuit to receive the first reference voltage. In various examples, the first circuitry comprises a second digital-to-analog conversion circuit comprising a second digital input and a second analog output, the second digital-to-analog conversion circuit being connected to the second voltage reference circuit to receive the second reference voltage. In various examples, the first circuitry comprises first addition circuitry, connected with the first analog output and the second analog output and to provide a first combined analog output from the first analog output and the second analog output.

In various examples, the second circuitry comprises a third digital-to-analog conversion circuit, comprising a third digital input and a third analog output, the third digital-to-analog conversion circuit being connected to the first voltage reference circuit to receive the first reference voltage. In various examples, the second circuitry comprises a fourth digital-to-analog conversion circuit, comprising a fourth digital input and a fourth analog output, the fourth digital-to-analog conversion circuit being connected to the second voltage reference circuit to receive the second reference voltage. In various examples, the second circuitry comprises second addition circuitry, connected with the third analog output and the fourth analog output and to provide a combined second analog output from the third analog output and the fourth analog output.

In various examples, a method of converting a digital input signal to a combined analog output signal with a first digital-to-analog conversion circuit and a second digital-to-analog conversion circuit is provided.

In various examples, the method comprises providing the first digital-to-analog conversion circuit with a first reference voltage and providing the second digital-to-analog conversion circuit with a second reference voltage, wherein the first reference voltage and the second reference voltage differ from each other.

In various examples, the method comprises providing a predefined number of most significant bits of the digital input signal to the first digital-to-analog conversion circuit.

In various examples, the method comprises providing a predefined number of least significant bits of the digital input signal to the second digital-to-analog conversion circuit.

In various examples, the method comprises combining an analog output of the first digital-to-analog conversion circuit with an analog output of the second digital-to-analog conversion circuit to obtain the combined analog output signal.

In various examples, the method comprises providing the predefined number of most significant bits and providing the predefined number of least significant bits so that the predefined number of most significant bits plus the predefined number of least significant bits correspond to a number of bits of the digital input signal.

In various examples, the method comprises controlling the second reference voltage to be less than the first reference voltage.

In various examples, the method comprises controlling the second reference voltage to correspond to the first reference voltage divided by two to the power of the number of least significant bits.

Reference will now be made to the drawings in which the various elements of examples will be given numerical designations and in which further examples will be discussed.

In all examples herein, the described components each represent individual items that are to be considered independent of one another, in the combination as shown or described, and in combinations other than shown or described. In addition, the described examples can also be supplemented by items other than those described.

Specific references to components, process steps, and other elements are not intended to be limiting. Further, it is understood that like parts bear the same or similar reference numerals when referring to alternate FIGS.

FIG. 1A shows a schematic block diagram of a circuitry 1 for converting a digital signal to an analog signal. In this example, a 14-bit digital to analog (D/A) conversion is implemented with a first and a second 12-bit digital-to-analog conversion (DAC) circuit 2, 3.

As can be seen from the FIG., the example uses separate DAC circuits 2, 3 (also referred to as 'channels'). It is noted that the teachings herein are not limited to the use of a separate DAC circuits 2, 3. In various examples, integrated DAC circuits may be used. Depending on the overall number of DAC circuits, a combination of separate DAC circuits and integrated DAC circuits may be used.

The first DAC circuit 2 is connected with a first voltage reference circuit 5. The first voltage reference circuit 5 provides the first DAC circuit 2 with a first reference voltage $V_{REF1}$, which in this example is a higher reference voltage—for example 5V. The second DAC circuit 3 is connected with a second voltage reference circuit 6. The second voltage reference circuit 6 provides the second DAC circuit 3 with a second reference voltage $V_{REF2}$, which in this example is a lower reference voltage—for example 1.25V.

The first DAC circuit 2 has a first digital input 7 and a first analog output 9, wherein the first analog output 9 to provide a first analog output signal 56. The second DAC circuit 3 has a second digital input 8 and a second analog output 10, wherein the second analog output 10 to provide a second analog output signal 57. The first and second digital inputs 7, 8 are connected to respective digital outputs 54, 55 of control circuit 51.

In the present example, a 14-bit digital input signal 50 is provided to control circuit 51, which in this example comprises a microcontroller. Control circuit 51 may in addition or alternatively to a microcontroller comprise any other suitable component, such as one or more of a processor, an FPGA, a shift register, a tapped register, a counter, a timing circuit, and the like. Control circuit 51 splits the digital input signal 50 and provides a first digital output signal 54 at a first digital output 58 and a second digital output signal 55 at a second digital output 59. These signals are correspondingly provided to the first digital input 7 of the first DAC circuit 2 and the second digital input 8 of the second DAC circuit, respectively. The first digital output signal 54 is provided with the 12 most significant (MS) bits of the 14-bit digital input signal 50. The second digital output signal 55 is provided with the 2 least significant (LS) bits of the 14-bit digital input signal 50. Accordingly, the first DAC circuit 2 is operated in the value range of 0-4095, while the second DAC circuit 3 is operated in the value range of 0-3, as can be seen in FIGS. 2 and 3. FIG. 2 shows a schematic overview of the operation of the examples of FIGS. 1A and 1B. FIG. 3 shows example input codes and the resulting output voltages for the examples shown in FIGS. 1A and 1B.

Referring back to FIG. 1A, the analog outputs 9, 10 of the two DAC circuits 2, 3, respectively, are added together using addition circuitry 12, such as an Op-Amp. The addition circuitry 12, 12A provides an analog output 52 with a 14-bit resolution. Thus, circuitry 1 for converting a digital signal to an analog signal uses two 12-bit (lower) resolution DAC circuits to perform a 14-bit D/A conversion, resulting in significant cost savings while providing high conversion quality.

Figure 1B:
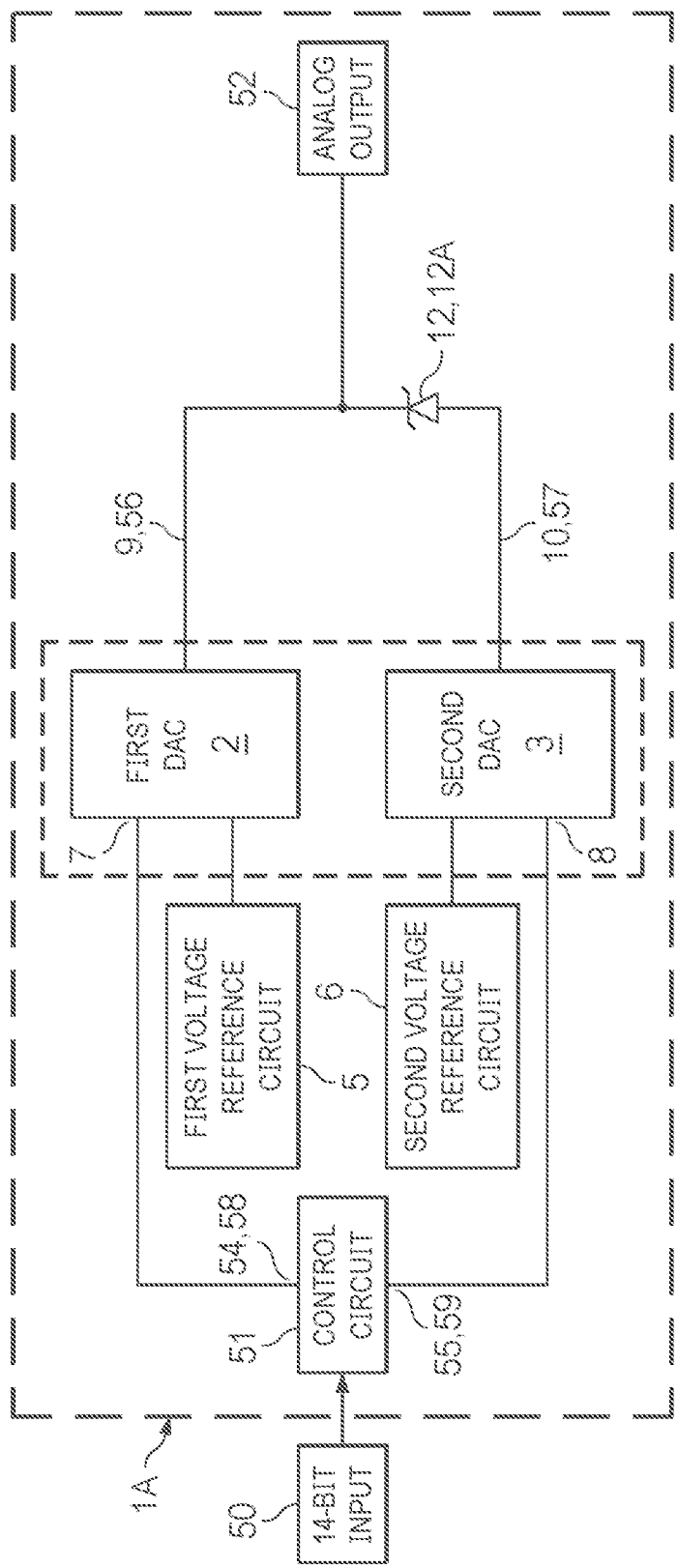
FIG. 1B shows a schematic block diagram of another example of circuitry implementing a 14-bit D/A conversion with two 12-bit digital-to-analog circuits.
Figure 2:
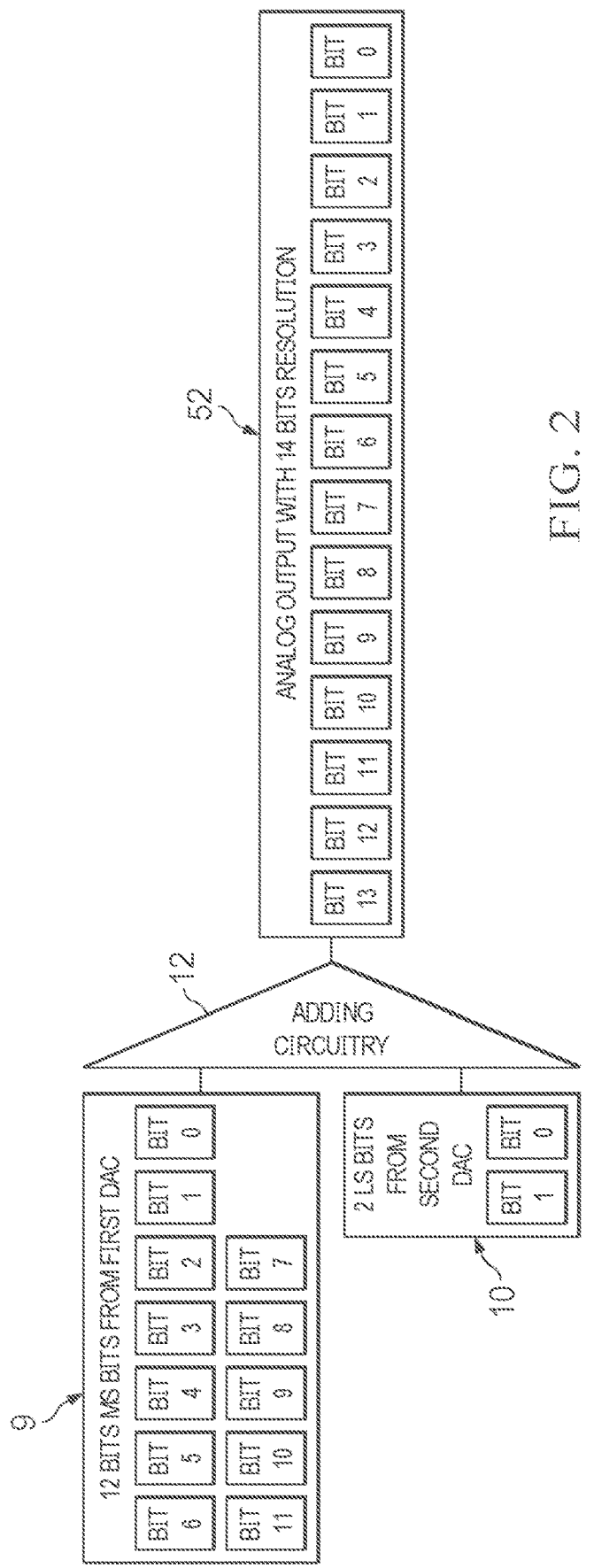
FIG. 2 shows a schematic overview of the operation of the examples of FIGS. 1A and 1B.

FIG. 1B shows a schematic block diagram of another example of circuitry 1A implementing a 14-bit D/A conversion with two 12-bit digital-to-analog circuits 2, 3. The example of FIG. 1B corresponds to the example of FIG. 1A with the exception that the addition circuitry 12 in this example is a Schottky diode 12A. While a Schottky diode 12A provides a more cost-efficient addition of the analog outputs 9, 10 of the two DAC circuits 2, 3, a compensation circuit (not shown) for the forward voltage drop of the Schottky diode 12A may be required. Alternatively, it is possible to adapt the operation of control circuit 51 to include the voltage drop when incrementing the second DAC circuit 3. A typical voltage drop across the Schottky diode 12A is 0.3V.

In the examples shown in FIGS. 1A and 1B, the first voltage reference circuit 5 supplies the first DAC circuit 2 with 5V as $V_{REF1}$. The second voltage reference circuit 6 supplies the second DAC circuit 3 with 1.25V as $V_{REF2}$. For a 14-bit resolution conversion, where the resolution of the second digital output signal is 2 bits, in accordance with equation 1 above, $V_{REF2}$ is set to $V_{REF1}/4$, i.e., $V_{REF2}$ is a quarter of $V_{REF1}$.

As indicated above, a general relationship between $V_{REF1}$ and $V_{REF2}$ can be formulated as $$V_{REF2} = \frac{V_{REF1}}{2^{n2}},$$

where $n_2$ is the number of bits applied to the second digital input 8 of the second DAC circuit 3, i.e., the resolution of the signal applied to the second digital input 8 of the second DAC circuit 3 in bits ($n_2 \geq 1$, $n_2$ is a full integer value). For each increment for the value of $n_2$, the resolution will increase by one bit. In the examples of FIGS. 1A and 1B, a two-bit signal is applied to second DAC circuit 3, resulting in $V_{REF2}$ to be a quarter of $V_{REF1}$.

It is noted that the teachings herein are not limited to providing a 14-bit D/A conversion using 12-bit DAC circuits. The teachings may in various examples be used for any desired resolution increase in a D/A conversion. In various examples, a 13-bit D/A conversion may be implemented by setting $V_{REF2}$ to $V_{REF1}/2$, i.e., $V_{REF1}$ divided by two, and providing a single LSB to the second DAC circuit 3, while using the same or similar 12-bit DAC circuits.

FIG. 3 shows example input codes for the examples shown in FIGS. 1A and 1B and the resulting output voltages. The column 'Code' designates the coded value of the digital input signal 50, provided to the control circuit 51. The column 'DAC1 code' shows the associated digital coded value of the first digital output signal 54 provided to first DAC circuit 2, i.e., the first digital input 7, by the control circuit 51, and the column 'DAC2 code' shows the associated coded value of the second digital output signal 55 provided to the second DAC circuit 3, i.e., the second digital input 8, by the control circuit 51. All columns are in integer format.

The column 'DAC1 output' shows the analog output of the first DAC circuit 2 in volts. The column 'DAC2 output' shows the analog output of the second DAC circuit 3 in volts. The column 'DAC1+DAC2' shows the combination of the analog outputs of the first DAC circuit 2 and the second DAC circuit 3 after the addition circuitry 12, i.e., $V_{OUT}$, in volts.

The table shows that with an input code at the first digital input 7 moving from 0 (Binary: 0000 0000 0000) to 4095 (Binary: 1111 1111 1111) and an input code at the second digital input 8 moving from 0 (Binary: 00) to 3 (Binary: 11), a total of 14-bits resolution can be achieved, i.e., the values of 0 (Binary: 00 0000 0000 0000) to 16383 (Binary: 11 1111 1111 1111) can be properly processed.

Given the reference voltage $V_{REF1}$ of 5V, for each step of the DAC code of DAC1, the analog output voltage of the first DAC circuit 2 increases by 1.2 mV (5V/4095=1.2 mV). Similarly, given the reference voltage $V_{REF2}$ of 1.25V, for each step of the DAC code of DAC2, the analog output voltage of the second DAC circuit 3 increases by 0.3 mV (1.25 V/4095=0.3 mV). The output of the first DAC circuit 2 remains the same for four subsequent codes at a time, since the four codes reflect changes in the 2 least significant bits with no change to the 12 most significant bits, while the output of the second DAC circuit 3 increments from 0 to 00031, 0.00061, 0.00092, as shown as the least significant bits effectively cycle through values 0 to 3.

The DAC1 code increments as follows: 0, 0, 0, 0, 1, 1, 1, 1, 2, 2, 2, 2 . . . 4095, 4095, 4095, 4095

The DAC2 code increments as follows: 0, 1, 2, 3, 0, 1, 2, 3, 0, 1, 2, 3 . . . 0, 1, 2, 3

For reference, a few initial input codes and a few last input codes are reproduced below. It is noted that the 'step pattern', i.e., the step sequence, as shown in FIG. 3 and discussed herein, is an example. Other step patterns are possible and may be used depending on the respective application. A different step pattern may be implemented by the control circuit 51 which then provides corresponding first and second digital output signals 54, 55.

Input code 0: DAC1=5/4095*0=0.00000, DAC2=1.25/4095*0=0.00000 DAC1+DAC2=0.00000+0.00000=0

Input code 1: DAC1=5/4095*0=0.00000, DAC2=1.25/4095*1=0.00031, DAC1+DAC2=0.00000+0.00031=0.00031

Input code 2: DAC1=5/4095*0=0.00000, DAC2=1.25/4095*2=0.00061, DAC1+DAC2=0.00000+0.00061=0.00061

Input code 3: DAC1=5/4095*0=0.00000, DAC2=1.25/4095*3=0.00092, DAC1+DAC2=0.00000+0.00092=0.00092

Input code 4: DAC1=5/4095*1=0.00122, DAC2=1.25/4095*0=0.00000, DAC1+DAC2=0.00122+0.00000=0.00122

Input code 5: DAC1=5/4095*1=0.00122, DAC2=1.25/4095*1=0.00031, DAC1+DAC2=0.00122+0.00031=0.00153

Input code 6: DAC1=5/4095*1=0.00122, DAC2=1.25/4095*2=0.00061, DAC1+DAC2=0.00122+0.00061=0.00183

Input code 7: DAC1=5/4095*1=0.00122, DAC2=1.25/4095*3=0.00092, DAC1+DAC2=0.00122+0.00092=0.00214

Input code 8: DAC1=5/4095*2=0.00244, DAC2=1.25/4095*0=0.00000, DAC1+DAC2=0.00244+0.00000=0.00244

Input code 16376: DAC1=5/4095*4094=4.99878, DAC2=1.25/4095*0=0.00000, DAC1+DAC2=4.99878

Input code 16377: DAC1=5/4095*4094=4.99878, DAC2=1.25/4095*1=0.00031, DAC1+DAC2=4.99878+0.00031=4.99909

Input code 16378: DAC1=5/4095*4094=4.99878, DAC2=1.25/4095*2=0.00061, DAC1+DAC2=4.99878+0.00061=4.99939

Input code 16379: DAC1=5/4095*4094=4.99878, DAC2=1.25/4095*3=0.00092, DAC1+DAC2=4.99878+0.00092=4.99970

Input code 16380: DAC1=5/4095*4095=5.00000, DAC2=1.25/4095*0=0.00000, DAC1+DAC2=5.00000+0.00000=5.00000

Input code 16381: DAC1=5/4095*4095=5.00000, DAC2=1.25/4095*1=0.00031, DAC1+DAC2=5.00000+0.00031=5.00031

Input code 16382: DAC1=5/4095*4095=5.00000, DAC2=1.25/4095*2=0.00061, DAC1+DAC2=5.00000+0.00061=5.00061

Input code 16383: DAC1=5/4095*4095=5.00000, DAC2=1.25/4095*3=0.00092, DAC1+DAC2=5.00000+0.00092=5.00092

In the example of FIG. 1B, i.e., when using Schottky diode 12, operation of control circuit 51 may be adapted to include the voltage drop, namely when incrementing the second DAC circuit 3. The following assumes a voltage drop of 0.3V of the Schottky diode 12. Instead of incrementing the second DAC circuit 3 as discussed in the preceding, namely:

0, 1, 2, 3, 0, 1, 2, 3, 0, 1, 2, 3 . . . 0, 1, 2, 3, the starting code for the second DAC circuit 3 is set to:

$$X*(1.25/4095) = 0.3 \text{ V}, \quad (2)$$

where X is the respective code for the second DAC circuit 3. The new code increments correspondingly consider the 0.3V voltage drop as an offset. As is apparent from the preceding equation (2), starting code "0" translates to code "983". Accordingly, when using Schottky diode 12A according to FIG. 1B, the above code increments of for the Second DAC circuit 3 are:

983, 984, 985, 986, 983, 984, 985, 986, 983, 984, 985, 986 . . . 983, 984, 985, 986.

Figure 4:
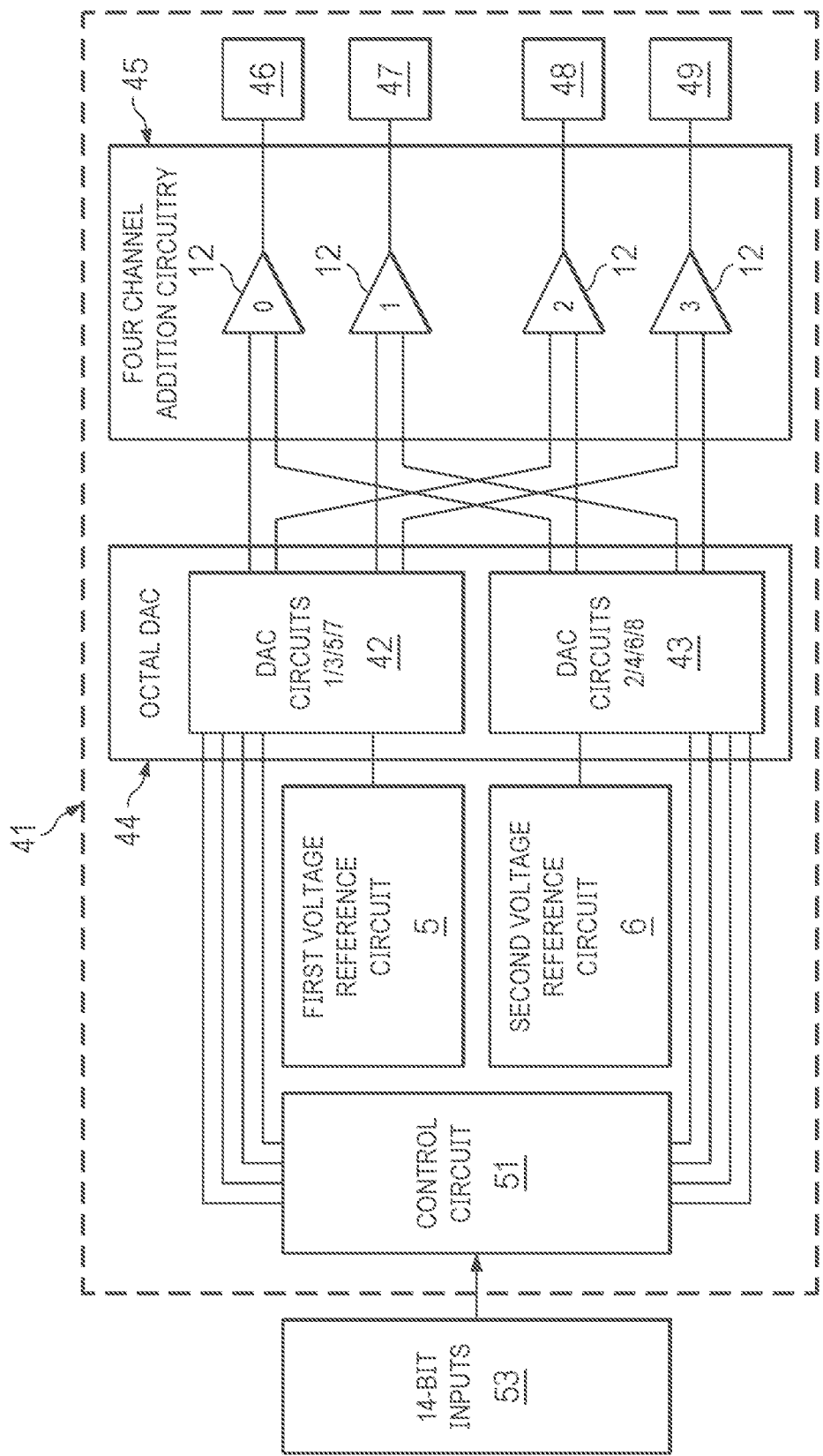
FIG. 4 shows another example of a 14-bit D/A conversion using 12-bit bit digital-to-analog circuits.

FIG. 4 shows another example implementation of a circuitry 41 for converting digital signals to analog signals. The circuitry 41 provides 14-bit D/A conversion using 12-bit DAC circuits. The operation of the example of FIG. 4 corresponds to the examples of FIGS. 1A and 1B with the following exceptions.

In the example of FIG. 4, the voltage reference circuits 5, 6 may be formed by MCP1502 voltage references, available from Microchip Technology, Inc, of Chandler, Arizona.

Instead of the separate DAC circuits 2,3 used in the examples of FIGS. 1A and 1B, the current example uses an 'Octal DAC' 44, i.e., an eight channel DAC essentially having eight independent digital-to-analog conversion circuits 42, 43. For example, a MCP48CMB28 DAC may be used, which is available from Microchip Technology, Inc. A four-channel addition circuitry 45 is used in the present example, namely an MCP6V14 four channel Op-Amp, available from Microchip Technology, Inc.

Using the eight channel DAC 44, i.e., having eight digital-to-analog conversion circuits 42, 43, a total of four independent digital input signals 53 can be processed simultaneously corresponding to the preceding discussion with reference to FIGS. 1-3.

All odd digital-to-analog conversion circuits 42 are supplied with a reference voltage $V_{REF1}$ of 5V. All even digital-to-analog conversion circuits 43 are supplied with a reference voltage $V_{REF2}$ of 1.25V to again provide an increased resolution of 14 bits from combining two 12-bit DAC circuits.

The outputs of DAC circuits 1 and 2 are combined as discussed with reference to FIGS. 1-3 to obtain a first output signal with 14-bit resolution at first analog output 46 from a first digital input signal, applied at control circuit 51.

The outputs of DAC circuits 3 and 4 are combined as discussed with reference to FIGS. 1-3 to obtain a second output signal with 14-bit resolution at second analog output 47 from a second digital input signal, applied at control circuit 51.

The outputs of DAC circuits 5 and 6 are combined as discussed with reference to FIGS. 1-3 to obtain a third output signal with 14-bit resolution at third analog output 48 from a third digital input signal, applied at control circuit 51.

The outputs of DAC circuits 7 and 8 are combined as discussed with reference to FIGS. 1-3 to obtain a fourth output signal with 14-bit resolution at fourth analog output 49 from a fourth digital input signal, applied at control circuit 51.

The multichannel setup of FIG. 4 may be particularly useful for sensor applications. Since the voltage references 5, 6 as well as the Op-Amps 12 are calibrated and tested prior to assembly, the final output may not need any additional testing. This decreases the overall cost for manufacturing.

The voltage reference circuits 5, 6 in this example can provide a 20 mA output. Thus, it is possible to provide the respective output to multiple DACs to reduce the total cost. As follows from FIG. 4, first voltage reference circuit 1 is connected to DAC circuits 1, 3, 5, and 7, while second voltage reference circuit 2 is connected to DAC circuits 2, 4, 6, and 8.

Figure 5A:
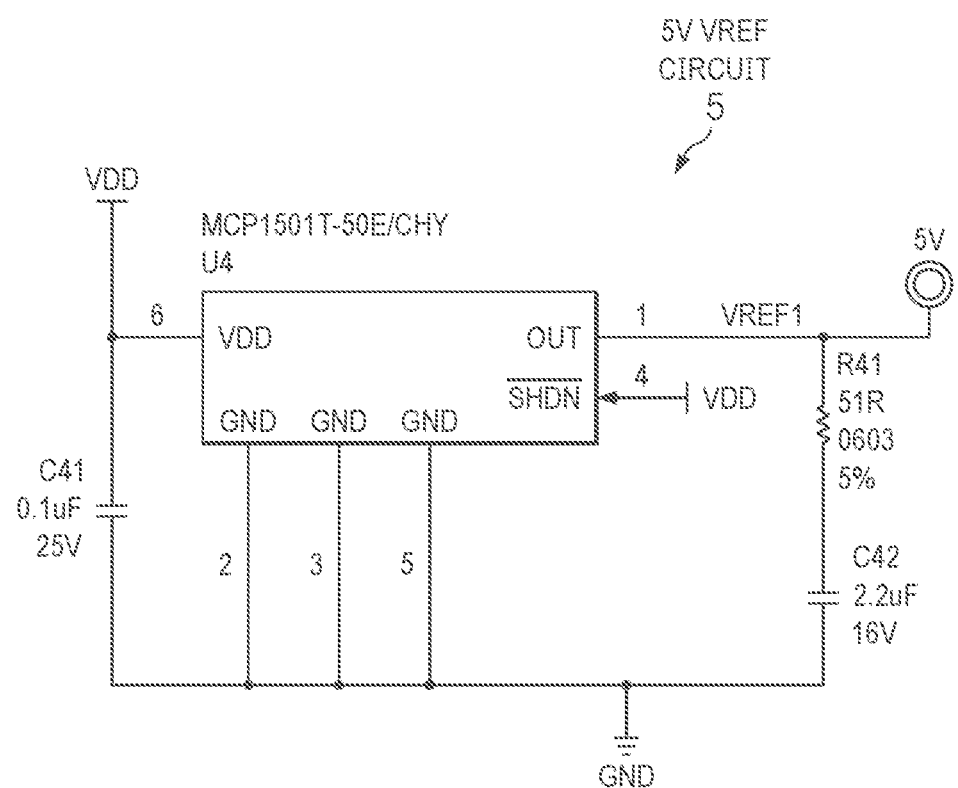
FIGS. 5A-5D show more detailed circuit diagrams of some components of the example of FIG. 4.
Figure 5B:
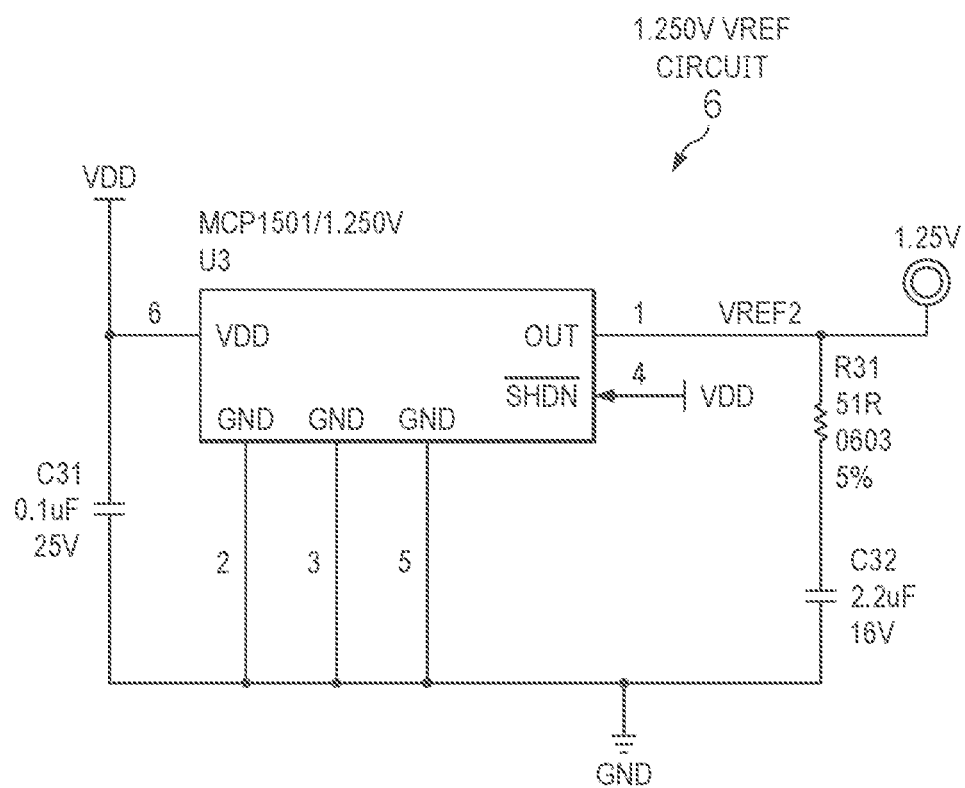
Figure 5C:
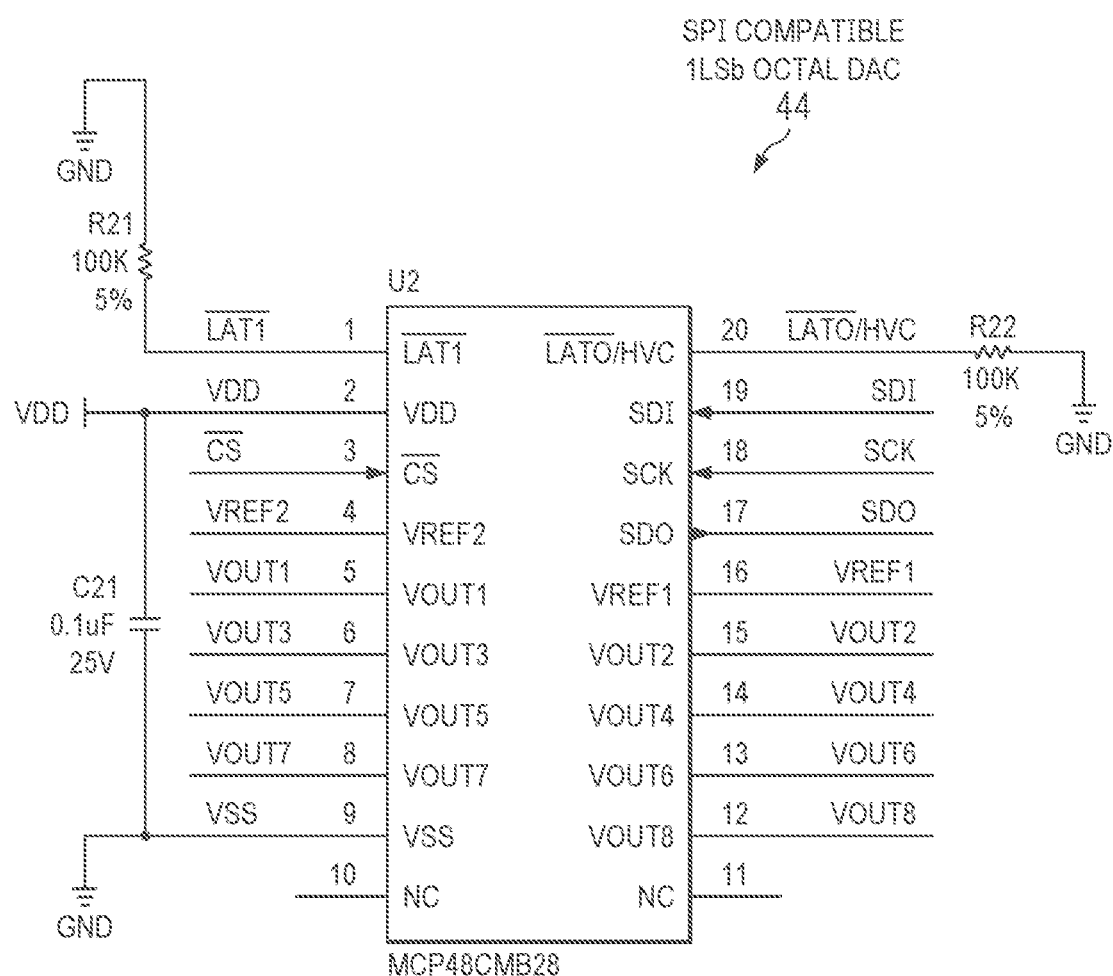
Figure 5D:
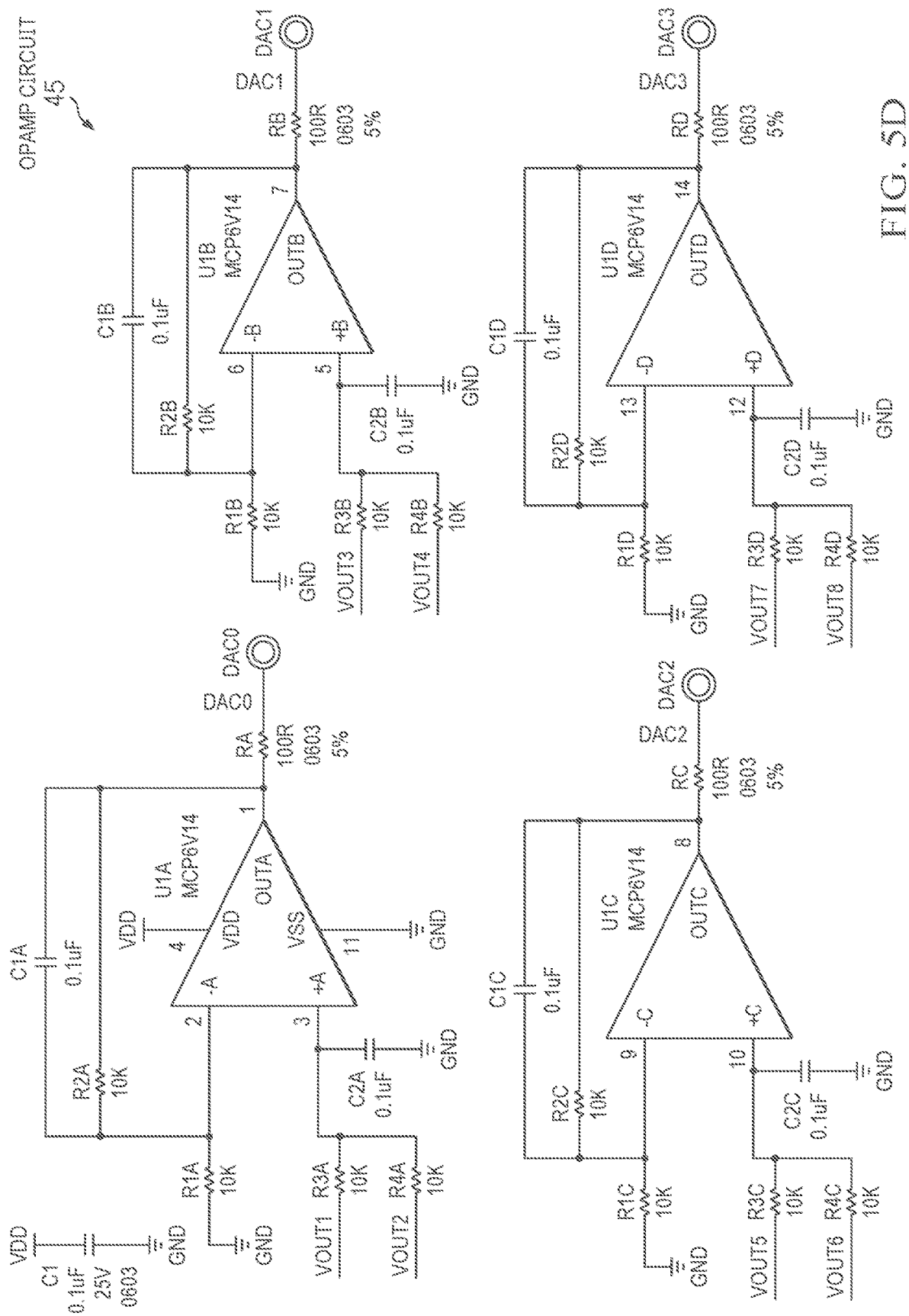

FIG. 5A shows a more detailed circuit diagram of the first voltage reference circuit 5. FIG. 5B shows a more detailed circuit diagram of the second voltage reference circuit 6. FIG. 5C shows a more detailed circuit diagram of the octal DAC 44. FIG. 5D shows a more detailed circuit diagram of the four-channel addition circuitry 45 of FIG. 4.

In some embodiments, multiple octal DACs 44, 44A, 44B may be operated in parallel to increase the number of channels further. A corresponding example circuitry 61 for converting 12 digital signals to 12 analog signals is shown in the schematic circuit diagram of FIGS. 6A and 6B.

Figure 6B:
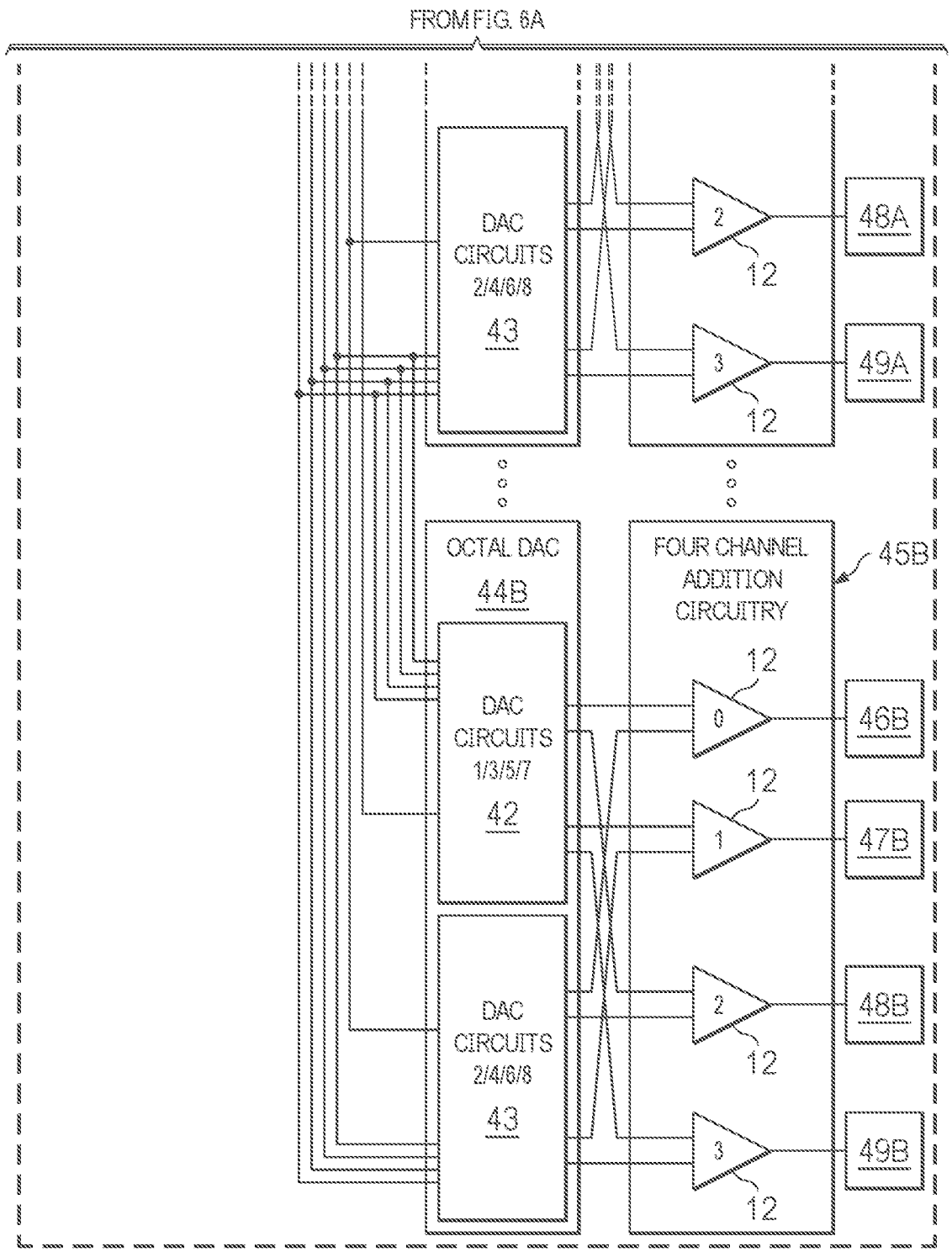

The setup shown in FIGS. 6A and 6B uses three octal DACs 44, 44A, 44B. Correspondingly, having 24 digital-to-analog conversion circuits 42, 43, a total of 12 independent digital input signals 53A can be processed simultaneously corresponding to the preceding discussion. The operation of control circuit 51A corresponds to the preceding discussion of control circuit 51 with the exception that the operation is adapted to process the 12 digital input signals 53A simultaneously.

As shown, three four-channel addition circuitries 45, 45A, 45B are provided to match the number of channels. In addition to the $1^{st}$ through $4^{th}$ analog outputs 46-49 discussed in the preceding, $5^{th}$-$12^{th}$ analog outputs 46A, 47A, 48A, 49A, 46B, 47B, 48B, and 49B are provided.

As follows from FIGS. 6A and 6B, it is possible to operate all three octal DACs 44, 44A, 44B using the same voltage reference circuits 5, 6, leading to a particularly cost-efficient setup. It is noted that the invention is not limited to 12 channels. A higher or lower number of channels is possible, within the bounds of the maximum output current of the voltage references 5, 6 and the input current requirements of the DACs 44, 44A, 44B.

The invention has been described in the preceding using various examples. Other variations to the disclosed examples may be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module, or other unit or device may fulfill the functions of several items recited in the claims.

The term "exemplary" used throughout the specification means "serving as an example, instance, or exemplification" and does not mean "preferred" or "having advantages" over other examples. The terms "in particular" and "particularly" used throughout the specification means "for example" or "for instance".

The mere fact that certain measures are recited in mutually different dependent claims or examples does not indicate that a combination of these measures cannot be used to advantage. Any reference signs in the claims should not be construed as limiting the scope.

What is claimed is:

1. A circuitry, comprising:
a first digital-to-analog conversion circuit, comprising a first digital input and a first analog output, the first analog output to provide a first analog output signal;
a second digital-to-analog conversion circuit, comprising a second digital input and a second analog output, the second analog output to provide a second analog output signal;
an addition circuitry, connected with the first analog output and the second analog output, the addition circuitry to provide a combined analog output signal from the first analog output signal and the second analog output signal;
a first voltage reference circuit, connected with the first digital-to-analog conversion circuit to provide a first reference voltage; and
a second voltage reference circuit, connected with the second digital-to-analog conversion circuit to provide a second reference voltage; and
a control circuit with at least:
a digital input;
a first digital output, connected with the first digital input of the first digital-to-analog conversion circuit, and
a second digital output, connected with the second digital input of the second digital-to-analog conversion circuit:
wherein
the first reference voltage and the second reference voltage differ from each other and wherein
the control circuit to provide at least a first digital output signal provided at the first digital output and a second digital output signal provided at the second digital output, from a digital input signal, received at the digital input.

2. The circuitry of claim 1, wherein the digital input signal represents one or more samples with a number of bits per sample and the control circuit to provide the first digital output signal with one or more samples having a predefined number of most significant bits of the respective samples of the digital input signal, and the control circuit to provide the second digital output signal with one or more samples having a predefined number of least significant bits of the respective samples of the digital input signal.

3. The circuitry of claim 2, wherein the number of most significant bits plus the number of least significant bits correspond to the number of bits per sample of the digital input signal.

4. The circuitry of claim 2, wherein the predefined number of most significant bits corresponds to a resolution of the first digital-to-analog conversion circuit.

5. The circuitry of claim 3, wherein the predefined number of most significant bits corresponds to a resolution of the first digital-to-analog conversion circuit.

6. The circuitry of claim 1, wherein the second reference voltage is less than the first reference voltage.

7. The circuitry of claim 1, wherein the second reference voltage is set to correspond to the first reference voltage divided by two to the power of the number of bits applied to the second digital-to-analog conversion circuit.

8. The circuitry of claim 1, wherein a resolution of the first digital-to-analog conversion circuit corresponds to a resolution of the second digital-to-analog conversion circuit.

9. The circuitry of claim 1, wherein the first digital-to-analog conversion circuit and the second digital-to-analog conversion circuit have a resolution of at least 12 bits.

10. The circuitry of claim 1, wherein the first digital-to-analog conversion circuit and the second digital-to-analog conversion circuit are formed integrally.

11. The circuitry of claim 1, wherein the first digital-to-analog conversion circuit and the second digital-to-analog conversion circuit are formed by a multi-channel digital-to-analog converter.

12. The circuitry of claim 1, wherein one or more of the first voltage reference circuit and the second voltage reference circuit comprise at least one high precision buffered voltage reference.

13. The circuitry of claim 1, wherein the digital input signal has a bit depth that is greater than a resolution of one or more of the first digital-to-analog conversion circuit and the second digital-to-analog conversion circuit.

14. The circuitry of claim 1, wherein the addition circuitry comprises one or more of an operational amplifier and a Schottky diode.

15. A system, comprising:
a first voltage reference circuit to provide a first reference voltage;
a second voltage reference circuit to provide a second reference voltage, wherein the first reference voltage and the second reference voltage differ from each other;
first circuitry; and
second circuitry; wherein
the first circuitry comprises:
a first digital-to-analog conversion circuit, comprising a first digital input and a first analog output, the first digital-to-analog conversion circuit being connected to the first voltage reference circuit to receive the first reference voltage;
a second digital-to-analog conversion circuit, comprising a second digital input and a second analog output, the second digital-to-analog conversion circuit being connected to the second voltage reference circuit to receive the second reference voltage; and
first addition circuitry, connected with the first analog output and the second analog output and to provide a first combined analog output from the first analog output and the second analog output; and wherein
the second circuitry comprises:
a third digital-to-analog conversion circuit, comprising a third digital input and a third analog output, the third digital-to-analog conversion circuit being connected to the first voltage reference circuit to receive the first reference voltage;
a fourth digital-to-analog conversion circuit, comprising a fourth digital input and a fourth analog output, the fourth digital-to-analog conversion circuit being connected to the second voltage reference circuit to receive the second reference voltage; and
second addition circuitry, connected with the third analog output and the fourth analog output, the second addition circuitry to provide a combined second analog output from the third analog output and the fourth analog output.

16. A method, comprising:
providing a first digital-to-analog conversion circuit with a first reference voltage;
providing a second digital-to-analog conversion circuit with a second reference voltage, wherein the first reference voltage and the second reference voltage differ from each other;
providing a predefined number of most significant bits of a digital input signal to the first digital-to-analog conversion circuit;
providing a predefined number of least significant bits of the digital input signal to the second digital-to-analog conversion circuit; and
combining an analog output of the first digital-to-analog conversion circuit with an analog output of the second digital-to-analog conversion circuit to obtain a combined analog output signal, wherein
the predefined number of most significant bits and the predefined number of least significant bits are provided so that the predefined number of most significant bits plus the predefined number of least significant I its correspond to a number of bits of the digital input signal.

17. The method of claim 16, comprising controlling the second reference voltage to be less than the first reference voltage.

18. The method of claim 16, comprising controlling the second reference voltage to correspond to the first reference voltage divided by two to the power of the number of least significant bits.

* * * * *